United States Patent
Fu et al.

(10) Patent No.: US 9,935,233 B2
(45) Date of Patent: Apr. 3, 2018

(54) ADDITIVE FOR PREPARING SUEDE ON POLYCRYSTALLINE SILICON CHIP AND USE METHOD THEREOF

(71) Applicant: Changzhou Shichuang Energy Technology Co., Ltd., Changzhou, Jiangsu (CN)

(72) Inventors: Liming Fu, Jiangsu (CN); Yuanyuan Zhang, Jiangsu (CN)

(73) Assignee: CHANGZHOU SHICHUANG ENERGY TECHNOLOGY CO., LTD., Changzhou, Jiangsu (CN)

( * ) Notice: Subject to any disclaimer, the term of this patent is extended or adjusted under 35 U.S.C. 154(b) by 83 days.

(21) Appl. No.: 14/376,502

(22) PCT Filed: Dec. 17, 2013

(86) PCT No.: PCT/CN2013/089693
§ 371 (c)(1),
(2) Date: Aug. 4, 2014

(87) PCT Pub. No.: WO2015/032154
PCT Pub. Date: Mar. 12, 2015

(65) Prior Publication Data
US 2016/0247957 A1    Aug. 25, 2016

(30) Foreign Application Priority Data

Sep. 4, 2013  (CN) .......................... 2013 1 0394703

(51) Int. Cl.
*H01L 31/18*   (2006.01)
*H01L 31/0236*   (2006.01)
*H01L 31/068*   (2012.01)
*C09K 13/08*   (2006.01)
*H01L 21/306*   (2006.01)

(52) U.S. Cl.
CPC ............ *H01L 31/182* (2013.01); *C09K 13/08* (2013.01); *H01L 21/30604* (2013.01); *H01L 31/02363* (2013.01); *H01L 31/068* (2013.01); *Y02E 10/547* (2013.01)

(58) Field of Classification Search
CPC ............ H01L 31/182; H01L 31/02363; H01L 21/30604; C09K 13/08
See application file for complete search history.

(56) References Cited

U.S. PATENT DOCUMENTS

| | | | | |
|---|---|---|---|---|
| 2002/0147300 A1* | 10/2002 | Matsumoto | ............... | B41N 3/08 528/422 |
| 2005/0148481 A1* | 7/2005 | Kaneko | .................... | C09G 1/02 510/202 |
| 2006/0075915 A1* | 4/2006 | Sonokawa | ............... | B41N 3/08 101/450.1 |

OTHER PUBLICATIONS

Translation of WO20100060273.*

* cited by examiner

Primary Examiner — Duy Vu N Deo

(57) ABSTRACT

The invention disclosed an additive for preparing suede on a polycrystalline silicon chip. The invention also provides a suede preparation liquid for preparing suede on a polycrystalline silicon chip, comprising: an acid solution and the aforementioned additive for preparing suede on a polycrystalline silicon chip. The invention also provides a method for preparing suede on a polycrystalline silicon chip, by using which suede can be prepared on the surface of a polycrystalline silicon chip with the foregoing suede preparation liquid.

15 Claims, 1 Drawing Sheet

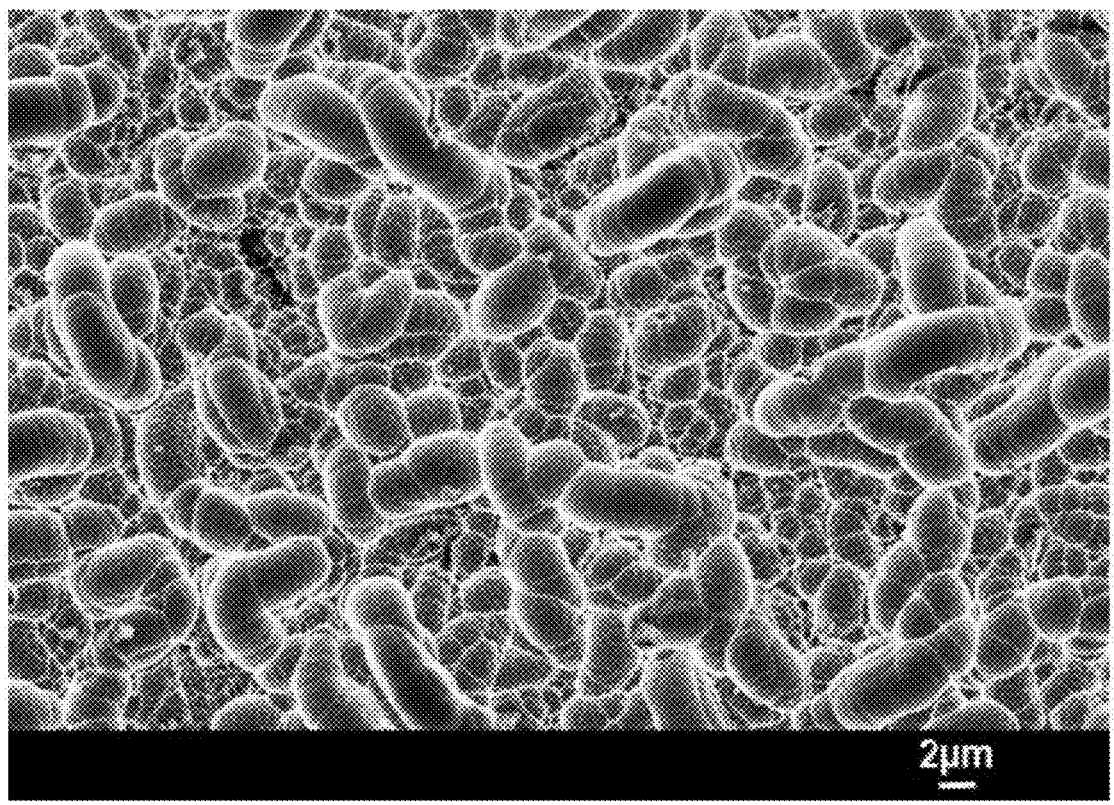

ADDITIVE FOR PREPARING SUEDE ON POLYCRYSTALLINE SILICON CHIP AND USE METHOD THEREOF

FIELD OF THE INVENTION

The invention relates to an additive for preparing suede on a polycrystalline silicon chip and the use method thereof.

BACKGROUND OF THE INVENTION

The preparation of suede on the surface of a silicon chip is a key link in the preparation of a polycrystalline silicon solar cell. The suede preparation effect directly influences the final conversion efficiency and the final rate of finished products of cell slices. As a polycrystalline silicon chip consists of crystalline grains in different crystal orientations and the crystal orientation of each crystalline grain is distributed optionally, in ordinary suede technologies, suede is formed on the surface of a polycrystalline silicon chip by means of the wet chemical corrosion of an acid solution. These suede preparation technologies based on the isotropic corrosion principle of an acid solution on silicon form, on surfaces of different crystalline grains of a silicon sheet, similar pit suede the shape and the appearance of which is irrelevant to orientations of the crystalline grains.

At present, the common acid solution used in industrial production consists of nitric acid, hydrofluoric acid and deionized water. The suede prepared with this acid solution is not desirable and has the following disadvantages: the suede is large in size and poor in uniformity, the color difference between different crystalline grains is obvious, there are deep etch pits of a black line shape in the macroscopic appearance of the suede, the reflection rate of the prepared suede is relatively high, and the stability of the suede prepared is not good. Thus, it will be of great significance to address the problems above by preparing suede through the addition of a suede preparation additive into an acid solution.

SUMMARY OF THE INVENTION

The object of the invention is to provide an additive for preparing suede on a polycrystalline silicon chip and the use method thereof, with the use of the additive for preparing suede on a polycrystalline silicon chip in the preparation of suede on a polycrystalline silicon chip, micropore-shaped microstructural suede having an excellent uniformity and no obvious color difference between crystalline grains can be obtained to reduce reflection rate and effectively decrease the number of black lines; by changing reaction mechanism and controlling reaction speed, the additive for preparing suede on a polycrystalline silicon chip disclosed herein enables the preparation of suede at a room temperature, thus greatly reducing temperature control cost, besides, a roller imprint is effectively removed, therefore, the silicon sheet is clearer to be better matched with subsequent procedures to achieve a much stable cell performance.

To achieve the purpose above, the invention provides an additive for preparing suede on a polycrystalline silicon chip, comprising: ammonium citrate, polyvinylpyrrolidone, polyvinyl alcohol, citric acid and water.

Preferably, the mass percent of each component of the additive for preparing suede on a polycrystalline silicon chip is as follows: ammonium citrate: 0.2-0.5%, polyvinylpyrrolidone: 0.1-1%, polyvinyl alcohol: 0.1-0.2%, citric acid: 2-2.5%, and water: the rest percent.

Preferably, the water is deionized water.

The invention also provides a suede preparation liquid for preparing suede on a polycrystalline silicon chip, comprising: the foregoing additive for preparing suede on a polycrystalline silicon chip and an acid solution in a mass ratio of 0.1-0.6:100, wherein 7-14% of HF aqueous solution and 25-50% of $HNO_3$ aqueous solution are proportioned in the acid solution, the HF aqueous solution contains 49% of HF, and the $HNO_3$ aqueous solution contains 69% of $HNO_3$, wherein the percent refers to mass percent.

The invention also provides a method for preparing suede on a polycrystalline silicon chip, by using which suede can be formed on the surface of a polycrystalline silicon chip with the foregoing suede preparation liquid.

Preferably, the suede is prepared on the surface of the polycrystalline silicon chip at a suede preparation temperature of 5-25 degrees centigrade for a suede preparation time of 45-180 s.

The method for preparing suede on a polycrystalline silicon chip specifically includes the following steps:

1) preparing a suede preparation additive: adding 0.2-0.5% of ammonium citrate, 0.1-1% of polyvinylpyrrolidone, 0.1-0.2% of polyvinyl alcohol and 2-2.5% of citric acid into the rest percent of water, mixing the components uniformly into the suede preparation additive, wherein the water is preferably deionized water;

2) preparing a suede preparation liquid: adding the suede preparation additive prepared in step 1) into an acid solution, uniformly mixing the suede preparation additive with the acid solution into the suede preparation liquid, wherein the mass ratio of the suede preparation additive to the acid solution is 0.1-0.6:100, 7-14% of HF aqueous solution and 25-50% of $HNO_3$ aqueous solution are proportioned in the acid solution, the HF aqueous solution contains 49% of HF, and the $HNO_3$ aqueous solution contains 69% of $HNO_3$, wherein the percent refers to mass percent;

3) immersing a polycrystalline silicon chip into the suede preparation liquid prepared in step 2) to prepare suede on the surface of the polycrystalline silicon chip at a suede preparation temperature of 5-25 degrees centigrade for a suede preparation time of 45-180 s.

The advantages and the beneficial effects of the invention are as follows: an additive for preparing suede on a polycrystalline silicon chip and the use method thereof are provided, with the use of the additive for preparing suede on a polycrystalline silicon chip in the preparation of suede of a polycrystalline silicon chip, micropore-shaped microstructural suede having an excellent uniformity and no obvious color difference between crystalline grains can be obtained to reduce reflection rate and effectively decrease the number of black lines; by changing reaction mechanism and controlling reaction speed, the additive for preparing suede on a polycrystalline silicon chip disclosed herein enables the preparation of suede at a room temperature, thus greatly reducing temperature control cost, besides, a roller imprint is effectively removed, therefore, the silicon sheet is clearer to be better matched with subsequent procedures to achieve a much stable cell performance

BRIEF DESCRIPTION OF THE DRAWINGS

FIG. 1 is a planer view of the suede on the surface of a polycrystalline silicon chip obtained in embodiment 3 of the invention and observed under a scanning electron microscope.

DETAILED DESCRIPTION OF THE PREFERRED EMBODIMENTS

The specific implementation mode of the invention is described below in detail with reference to accompanying drawings when read in conjunction with embodiments. The embodiments are merely illustrative of the technical solution of the invention more readily but are not to be construed as limiting the protection scope of the invention.

The specific technical solution of the invention is as follows:

Embodiment 1

A method for preparing suede on a polycrystalline silicon chip specifically includes the following steps:

1) preparing a suede preparation additive: dissolving 0.2 g ammonium citrate, 0.1 g polyvinylpyrrolidone, 0.1 g polyvinyl alcohol and 2 g citric acid in deionized water to prepare 100 g suede preparation additive;

2) preparing a suede preparation liquid: dissolving 7 kg HF aqueous solution (containing 49% by mass of HF) and 25 kg $HNO_3$ aqueous solution (containing 69% by mass of $HNO_3$) in deionized water to obtain 100 kg acid solution, and adding the 100 g suede preparation additive prepared in step 1) into the acid solution to obtain the suede preparation liquid;

3) preparing suede: immersing a polycrystalline silicon cell slice into the suede preparation liquid prepared in step 2) to prepare suede on the surface of the polycrystalline silicon cell slice at a suede preparation temperature of 5 degrees centigrade for a suede preparation time of 180 s.

Embodiment 2

A method for preparing suede on a polycrystalline silicon chip specifically includes the following steps:

1) preparing a suede preparation additive: dissolving 3 g ammonium citrate, 6 g polyvinylpyrrolidone, 1.2 g polyvinyl alcohol and 15 g citric acid in a solvent of deionized water to prepare 600 g suede preparation additive;

2) preparing a suede preparation liquid: mixing 14 kg HF aqueous solution (containing 49% by mass of HF) with 50 kg $HNO_3$ aqueous solution (containing 69% by mass of $HNO_3$) in deionized water to obtain 100 kg acid solution, and adding the 600 g suede preparation additive prepared in step 1) into the acid solution to obtain the suede preparation liquid;

3) preparing suede: immersing a polycrystalline silicon cell slice into the suede preparation liquid prepared in step 2) to prepare suede on the surface of the polycrystalline silicon cell slice at a suede preparation temperature of 25 degrees centigrade for a suede preparation time of 45 s.

Embodiment 3

A method for preparing suede on a polycrystalline silicon chip specifically includes the following steps:

1) preparing a suede preparation additive: dissolving 1.2 g ammonium citrate, 1.5 g polyvinylpyrrolidone, 0.45 g polyvinyl alcohol and 6.9 g citric acid in a solvent of deionized water to prepare 300 g suede preparation additive;

2) preparing a suede preparation liquid: dissolving 10 kg HF aqueous solution (containing 49% by mass of HF) and 40 kg $HNO_3$ aqueous solution (containing 69% by mass of $HNO_3$) in deionized water to obtain 100 kg acid solution, and adding the 300 g suede preparation additive prepared in step 1) into the acid solution to obtain the suede preparation liquid;

3) preparing suede: immersing a polycrystalline silicon cell slice into the suede preparation liquid prepared in step 2) to prepare suede on the surface of the polycrystalline silicon cell slice at a suede preparation temperature of 12 degrees centigrade for a suede preparation time of 100 s.

FIG. 1 shows a picture of the suede prepared on the surface of a polycrystalline silicon chip in embodiment 3 and observed under a scanning electron microscope, it can be seen from FIG. 1 that micropore-typed microstructural suede is formed on the surface of the silicon sheet and that the suede distribution is relatively uniform.

The mentioned above is only preferred embodiments, it should be appreciated that various modification and variations can be devised by those skilled in the art without departing from the technical principle of the invention and such modification and variations should fall into the protection scope of the invention.

What is claimed is:

1. An additive for preparing suede on a monocrystalline silicon chip, comprising: ammonium citrate, polyvinylpyrrolidone, polyvinyl alcohol, citric acid and water, wherein the mass percent of each component of the suede preparation additive for a monocrystalline silicon is as follows: ammonium citrate: 0.2-0.5%, polyvinylpyrrolidone: 0.1-1%, polyvinyl alcohol: 0.1-0.2%, citric acid: 2-2.5%, and water: the rest percent.

2. The additive for preparing suede on a polycrystalline silicon chip according to claim 1, wherein the water is deionized water.

3. A suede preparation liquid for preparing suede on a monocrystalline silicon chip, comprising: the additive for preparing suede on a polycrystalline silicon chip of claim 1 and an acid solution in a mass ratio of 0.1-0.6:100, wherein 7-14% of HF aqueous solution and 25-50% of HN03 aqueous solution are proportioned in the acid solution, the HF aqueous solution contains 49% of HF, and the HN03 aqueous solution contains 69% of HN03, wherein the percent refers to mass percent.

4. A method for preparing suede on a polycrystalline silicon chip, by using which suede is preparation on the surface of the polycrystalline silicon chip with the suede preparation liquid claimed in claim 3.

5. The method for preparing suede on a polycrystalline silicon chip according to claim 4, wherein the suede is prepared on the surface of the polycrystalline silicon chip at a suede preparation temperature of 5-25 degrees centigrade for a suede preparation time of 45-180 s.

6. The method for preparing suede on a polycrystalline silicon chip according to claim 5, comprising the following specific steps:

1) preparing a suede preparation additive: adding 0.2-0.5% of ammonium citrate, 0.1-1% of polyvinylpyrrolidone, 0.1-0.2% of polyvinyl alcohol, 2-2.5% of citric acid into the rest percent of water, mixing the components uniformly into the suede preparation additive;

2) preparing a suede preparation liquid: adding the suede preparation additive prepared in step 1) into an acid solution, uniformly mixing the suede preparation additive with the acid solution into the suede preparation liquid, wherein the mass ratio of the suede preparation additive to the acid solution is 0.1-0.6:100, wherein 7-14% of HF aqueous solution and 25-50% of HN03 aqueous solution are proportioned in the acid solution, the HF aqueous solution contains 49% of HF, and the HN03 aqueous solution contains 69% of HN03, wherein the percent refers to mass percent;

3) immersing a polycrystalline silicon chip into the suede preparation liquid prepared in step 2) to prepare suede on the surface of the polycrystalline silicon chip at a suede preparation temperature of 5-25 degrees centigrade for a suede preparation time of 45-180 s.

7. The additive for preparing suede on a polycrystalline silicon chip according to claim 1, wherein the water is deionized water.

8. A suede preparation liquid for preparing suede on a monocrystalline silicon chip, comprising: the additive for preparing suede on a polycrystalline silicon chip of claim 1 and an acid solution in a mass ratio of 0.1-0.6:100, wherein 7-14% of HF aqueous solution and 25-50% of HN03 aqueous solution are proportioned in the acid solution, the HF aqueous solution contains 49% of HF, and the HN03 aqueous solution contains 69% of HN03, wherein the percent refers to mass percent.

9. A method for preparing suede on a polycrystalline silicon chip, by using which suede is preparation on the surface of the polycrystalline silicon chip with the suede preparation liquid claimed in claim 8.

10. The method for preparing suede on a polycrystalline silicon chip according to claim 9, wherein the suede is prepared on the surface of the polycrystalline silicon chip at a suede preparation temperature of 5-25 degrees centigrade for a suede preparation time of 45-180 s.

11. The method for preparing suede on a polycrystalline silicon chip according to claim 10, comprising the following specific steps:
1) preparing a suede preparation additive: adding 0.2-0.5% of ammonium citrate, 0.1-1% of polyvinylpyrrolidone, 0.1-0.2% of polyvinyl alcohol, 2-2.5% of citric acid into the rest percent of water, mixing the components uniformly into the suede preparation additive;
2) preparing a suede preparation liquid: adding the suede preparation additive prepared in step 1) into an acid solution, uniformly mixing the suede preparation additive with the acid solution into the suede preparation liquid, wherein the mass ratio of the suede preparation additive to the acid solution is 0.1-0.6:100, wherein 7-14% of HF aqueous solution and 25-50% of HN03 aqueous solution are proportioned in the acid solution, the HF aqueous solution contains 49% of HF, and the HN03 aqueous solution contains 69% of HN03, wherein the percent refers to mass percent;
3) immersing a polycrystalline silicon chip into the suede preparation liquid prepared in step 2) to prepare suede on the surface of the polycrystalline silicon chip at a suede preparation temperature of 5-25 degrees centigrade for a suede preparation time of 45-180 s.

12. A suede preparation liquid for preparing suede on a monocrystalline silicon chip, comprising: the additive for preparing suede on a polycrystalline silicon chip of claim 2 and an acid solution in a mass ratio of 0.1-0.6:100, wherein 7-14% of HF aqueous solution and 25-50% of HN03 aqueous solution are proportioned in the acid solution, the HF aqueous solution contains 49% of HF, and the HN03 aqueous solution contains 69% of HN03, wherein the percent refers to mass percent.

13. A method for preparing suede on a polycrystalline silicon chip, by using which suede is preparation on the surface of the polycrystalline silicon chip with the suede preparation liquid claimed in claim 12.

14. The method for preparing suede on a polycrystalline silicon chip according to claim 13, wherein the suede is prepared on the surface of the polycrystalline silicon chip at a suede preparation temperature of 5-25 degrees centigrade for a suede preparation time of 45-180 s.

15. The method for preparing suede on a polycrystalline silicon chip according to claim 14, comprising the following specific steps:
1) preparing a suede preparation additive: adding 0.2-0.5% of ammonium citrate, 0.1-1% of polyvinylpyrrolidone, 0.1-0.2% of polyvinyl alcohol, 2-2.5% of citric acid into the rest percent of water, mixing the components uniformly into the suede preparation additive;
2) preparing a suede preparation liquid: adding the suede preparation additive prepared in step 1) into an acid solution, uniformly mixing the suede preparation additive with the acid solution into the suede preparation liquid, wherein the mass ratio of the suede preparation additive to the acid solution is 0.1-0.6:100, wherein 7-14% of HF aqueous solution and 25-50% of HN03 aqueous solution are proportioned in the acid solution, the HF aqueous solution contains 49% of HF, and the HN03 aqueous solution contains 69% of HN03, wherein the percent refers to mass percent;
3) immersing a polycrystalline silicon chip into the suede preparation liquid prepared in step 2) to prepare suede on the surface of the polycrystalline silicon chip at a suede preparation temperature of 5-25 degrees centigrade for a suede preparation time of 4-180 s.

* * * * *